United States Patent
Tolbert et al.

(10) Patent No.: US 9,451,727 B2
(45) Date of Patent: Sep. 20, 2016

(54) HEAT SINK FOR A SQUARE CAMERA

(71) Applicant: GoPro, Inc., San Mateo, CA (US)

(72) Inventors: William H. Tolbert, San Mateo, CA (US); Evan L. Coons, San Mateo, CA (US)

(73) Assignee: GoPro, Inc., San Mateo, CA (US)

( * ) Notice: Subject to any disclaimer, the term of this patent is extended or adjusted under 35 U.S.C. 154(b) by 0 days.

(21) Appl. No.: 14/572,557

(22) Filed: Dec. 16, 2014

(65) Prior Publication Data
US 2016/0174408 A1    Jun. 16, 2016

(51) Int. Cl.
| | | |
|---|---|---|
| H04N 5/225 | (2006.01) | |
| H04N 9/64 | (2006.01) | |
| G03B 17/55 | (2006.01) | |
| H05K 7/20 | (2006.01) | |
| H05K 1/18 | (2006.01) | |
| H05K 1/02 | (2006.01) | |

(52) U.S. Cl.
CPC .......... *H05K 7/2039* (2013.01); *H04N 5/2252* (2013.01); *H04N 5/2253* (2013.01); *H04N 5/2254* (2013.01); *H05K 1/0203* (2013.01); *H05K 1/181* (2013.01)

(58) Field of Classification Search
CPC .. H05K 7/2039; H05K 1/181; H04N 5/2253; H04N 5/2252; H04N 1/0203; H04N 5/2254; H04N 9/64; G03B 17/55
USPC .............. 348/373–376, 335, 208.99, 207.99; 396/57, 571, 572; 374/1, 163, 183, 169
See application file for complete search history.

(56) References Cited

U.S. PATENT DOCUMENTS

| | | | |
|---|---|---|---|
| 6,015,092 A | 1/2000 | Postlewaite et al. | |
| 7,329,869 B2* | 2/2008 | Cassel | H04N 5/33 250/339.03 |
| 8,494,359 B2 | 7/2013 | Ogasawara et al. | |
| 2010/0165132 A1* | 7/2010 | Tokiwa | G02B 27/646 348/208.11 |
| 2013/0107111 A1* | 5/2013 | Campbell | H04N 5/2252 348/373 |
| 2013/0292477 A1 | 11/2013 | Hennick et al. | |
| 2014/0104479 A1* | 4/2014 | Samuels | G03B 17/55 348/335 |
| 2014/0168507 A1* | 6/2014 | Renaud | H04N 5/2257 348/373 |
| 2014/0294375 A1 | 10/2014 | Shintani | |

OTHER PUBLICATIONS

PCT International Search Report and Written Opinion for PCT/US2015/047594, Nov. 27, 2015, 15 Pages.

* cited by examiner

*Primary Examiner* — Tuan Ho
*Assistant Examiner* — Marly Camargo
(74) *Attorney, Agent, or Firm* — Fenwick & West LLP

(57) ABSTRACT

A camera having a substantially cubic form factor comprises, among other components, an image sensor, a lens assembly, a printed circuit board, and a heat sink. A heat sink operates to provide a thermally conductive path to an external surface of the camera. The heat sink comprises an external portion structured around a perimeter of the lens window and at least one arm extending perpendicular from the external portion to the interior of the camera. The at least one arm is thermally coupled to the at least one electronic component on the printed circuit board so as to conduct heat away from the electronics to the exterior of the camera.

20 Claims, 9 Drawing Sheets

HEAT SINK FOR A SQUARE CAMERA

BACKGROUND

1. Technical Field

This disclosure relates generally to a camera system, and more specifically to a heat sink for a camera system.

2. Description of the Related Art

Digital cameras are becoming faster and more powerful. As their capabilities improve, the processing power consumed to enable the faster speeds and greater resolution increases significantly. As power consumption increases, it is beneficial to dissipate heat from the electronics to prevent the components from malfunctioning or becoming damaged.

BRIEF DESCRIPTIONS OF THE DRAWINGS

The disclosed embodiments have other advantages and features which will be more readily apparent from the following detailed description of the invention and the appended claims, when taken in conjunction with the accompanying drawings, in which:

DETAILED DESCRIPTION

Figure 1A:
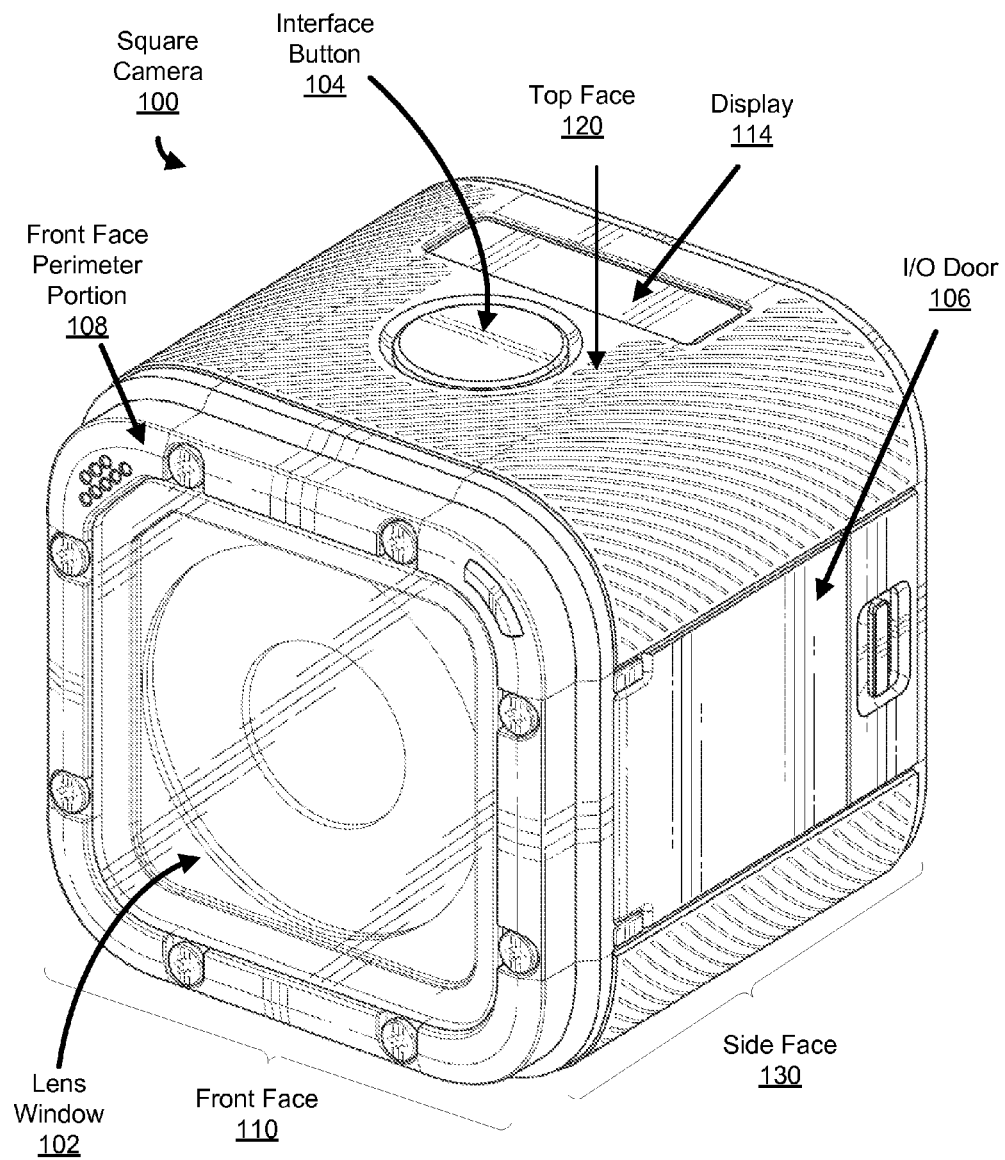
FIG. 1A illustrates a perspective view of a camera, according to one embodiment.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Example Configuration Overview

A camera comprises, among other components, an image sensor, a lens assembly, a printed circuit board, and a heat sink. A front face of the camera includes a lens window. Light entering the lens window is directed by the lens assembly to the image sensor. A printed circuit board includes at least one electronic component to process the images captured by the image sensor. In an embodiment, the printed circuit board is oriented substantially perpendicular to the front face of the camera. The electronics of the printed circuit board may generate a substantial amount of heat when in operation. A heat sink operates to provide a thermally conductive path to an external surface of the camera. For example, in one embodiment, the heat sink comprises an external portion structured around a perimeter of the lens window and at least one arm extending perpendicular from the external portion to the interior of the camera. The at least one arm is thermally coupled to the at least one electronic component on the printed circuit board so as to conduct heat away from the electronics to the exterior of the camera.

In an embodiment, the camera comprises a substantially cubic camera housing comprising a bottom face, left face, right face, back face, and top face each comprising a first material. The housing substantially encloses the lens assembly. A front face of the camera comprises a substantially square lens window and a front face perimeter portion surrounding the lens window. The front face perimeter portion includes a second material having a thermal conductivity substantially higher than the first material and is thermally coupled to heat-producing internal electronics of the camera to dissipate heat from the heat-producing internal electronics during operation.

In another embodiment, the camera further includes a memory card slot having an opening on a side face of the camera. The memory card slot is oriented diagonally relative to the front face of the camera such that acute angles are formed between the side face of the camera having the opening and the memory card slot, and between a bottom face of the camera and the memory card slot. The heat sink is structured such that the at least one arm extends into the interior of the camera through an opening between the side face of the camera, the bottom face of the camera, and the memory card slot.

Square Camera Overview

Figure 1B:
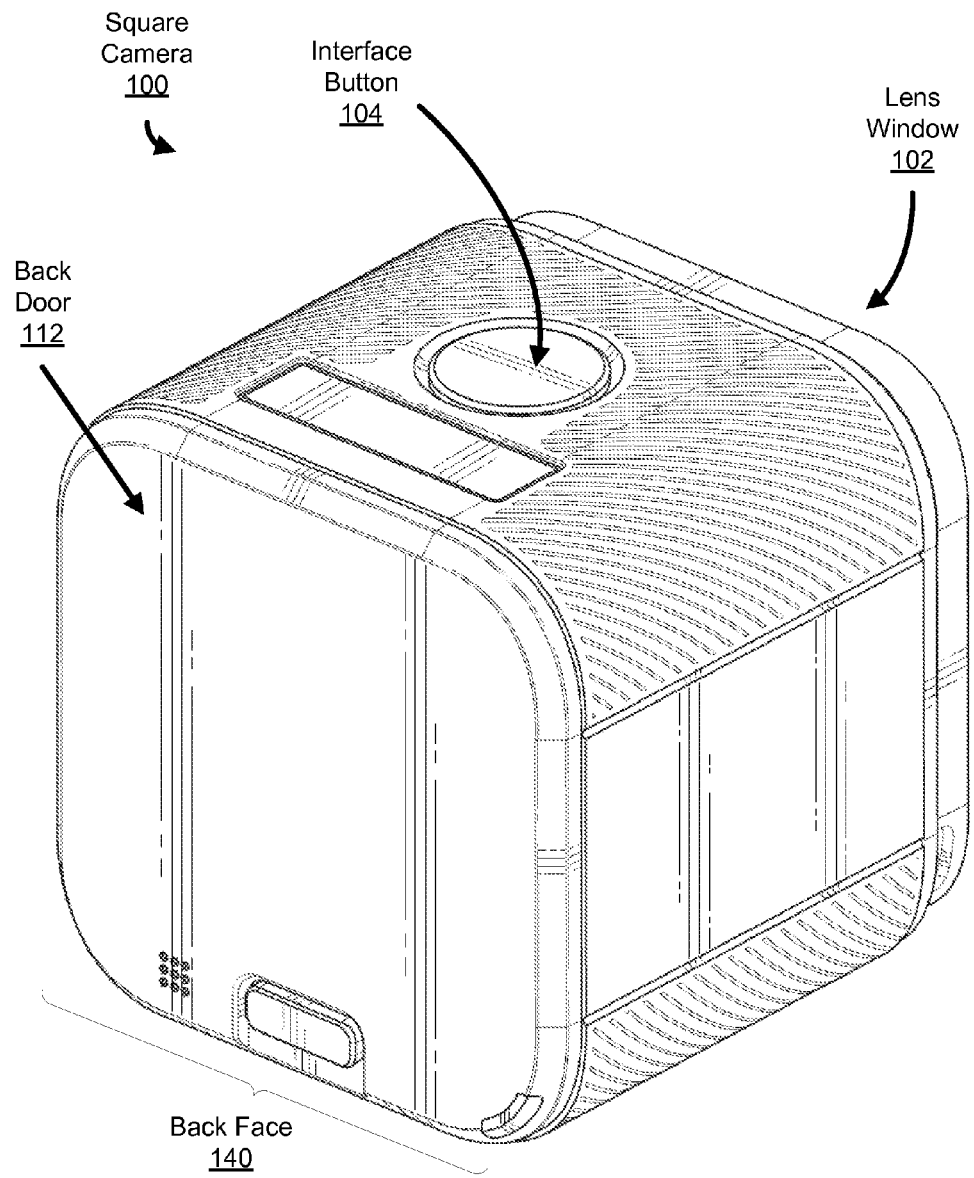
FIG. 1B illustrates an alternative perspective view of a camera, according to one embodiment.

FIGS. 1A-1B illustrate perspective views of an example square camera 100, according to one embodiment. The square camera 100 comprises at least one cross-section having four approximately equal length sides in a two-dimensional plane. Although the cross-section is substantially square, the corners of the cross-section may be rounded in some embodiments (e.g., a rounded square or squircle). The exterior of the square camera 100 includes 6 surfaces (i.e. a front face, a left face, a right face, a back face, a top face, and a bottom face). In the illustrated embodiment, the exterior surfaces substantially conform to a rectangular cuboid, which may have rounded or unrounded corners. In one example embodiment, all camera surfaces may also have a substantially square (or rounded square) profile, making the square camera 100 substantially cubic. In alternate embodiments, only two of the six faces (e.g., the front face 110 and back face 140) have equal length sides and the other faces may be other shapes, such as rectangles. The square camera 100 can have a small form factor (e.g. a height of 2 cm to 9 cm, a width of 2 cm to 9 cm, and a depth of 2 cm to 9 cm) and is made of a rigid material such as plastic, rubber, aluminum, steel, fiberglass, or a combination of materials.

In an embodiment, the square camera 100 includes a camera lens window 102 surrounded by a front face perimeter portion 108 on a front face 110, an interface button 104 and a display 114 on a top face 120, an I/O door 106 on a side face 130, and a back door 112 on a back face 140. The camera lens window 102 comprises a transparent or substantially transparent material (e.g., glass or plastic) that enables light to pass through to an internal lens assembly. In one embodiment, the camera lens window 102 is substantially flat (as opposed to a convex lens window found in many conventional cameras). The front face 110 of the camera 100 furthermore comprises a front face perimeter portion 108 that surrounds the lens window 102. In one embodiment, the front face perimeter portion 108 comprises a thermally conductive material (e.g., metal) and provides an external surface to dissipate heat from components internal to the camera 100 as will be described below. In one embodiment, the front face perimeter portion 108 comprises a set of screws to secure the front face perimeter portion 108 to the remainder of the housing of the camera 100 and to hold the lens window 102 in place. In one embodiment, the remainder of the housing of the camera 100 (not including the front face 110) comprises a material such as rubber or plastic that has substantially lower thermal conductivity than the front face perimeter portion 108. These surfaces therefore enable a user to comfortably hold or interact with the camera without the user having to directly contact the thermally conductive portion, which may become hot to the touch during operation.

The interface button 104 provides a user interface that when activated enables a user to control various functions of the camera 100. For example, pressing the button 104 may control the camera to power on or power off, take pictures or record video, save a photo, adjust camera settings, or perform any other action relevant to recording or storing digital media. In one embodiment, the interface button 104 may perform different functions depending on the type of interaction (e.g., short press, long press, single tap, double tap, triple tap, etc.) In alternative embodiments, these functions may also be controlled by other types of interfaces such as a knob, a switch, a dial, a touchscreen, voice control, etc. Furthermore, the camera 100 may have more than one interface button 104 or other controls. The display 114 comprises, for example, a light emitting diode (LED) display, a liquid crystal display (LCD) or other type of display for displaying various types of information such as camera status and menus. In alternative embodiments, the interface button 104, display 106, and/or other interface features may be located elsewhere on the camera 100.

The I/O door 106 provides a protective cover for various input/output ports of the camera 100. For example, in one embodiment, the camera 100 includes a Universal Serial Bus (USB) port and/or a High-Definition Media Interface (HDMI) port, and a memory card slot accessible behind the I/O door 106. In other embodiments, additional or different input/output ports may be available behind the I/O door 106 or elsewhere on the camera 100.

The back door 112 provides a protective cover that when removed enables access to internal components of the camera 100. For example, in one embodiment, a removable battery is accessible via the back door 112.

In some embodiments, the square camera 100 described herein includes features other than those described below. For example, instead of a single interface button 104, the square camera 100 can include additional buttons or different interface features, such as a microphone opening to receive voice or other audio commands, speakers, and/or various input/output ports.

Figure 2:
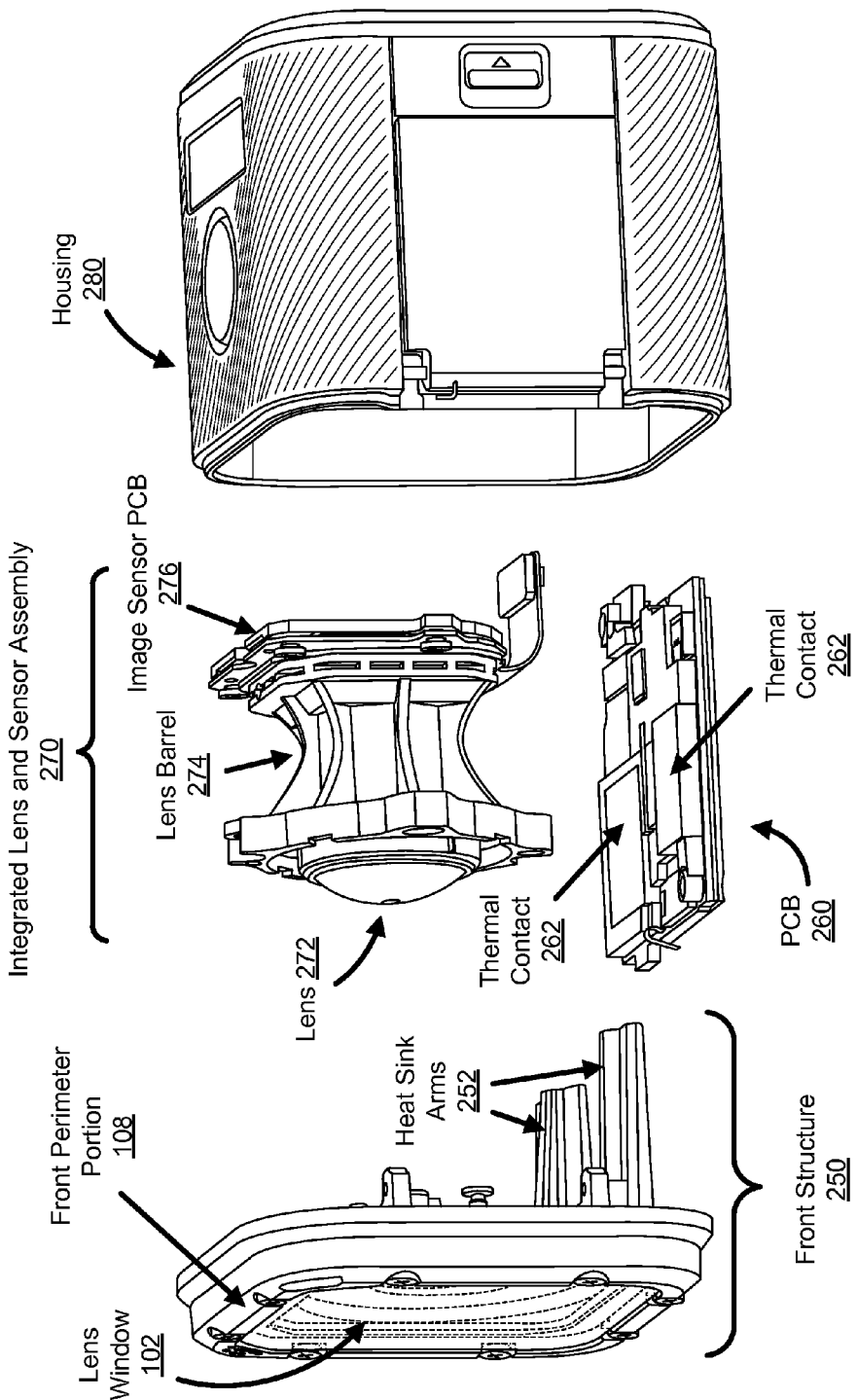
FIG. 2 illustrates an exploded view of selected components of a camera, according to one embodiment.

FIG. 2 is an exploded view illustrating a subset of the components of the camera 100 including a front structure 250, a PCB 260, an integrated lens and sensor assembly 270, and a housing 280. Other internal components of the camera 100 (e.g., a battery, memory card slot, I/O ports, various circuit components, structural components, etc.) are omitted from the FIG. 2 for ease of description. As illustrated, an integrated lens and sensor assembly 270 comprises one or more lenses 272, a lens barrel 274 (which may include additional internal lenses), and an image sensor printed circuit board (PCB) 276. The image sensor PCB 276 comprises an image sensor and associated circuitry that captures images and/or video from light passing through the lens window 102, lens 272, and lens barrel 274. The lens 272 can be any type of optical lens that facilitates capturing images or video, such as a wide-angle lens, an adjustable lens, a macro lens, and the like.

The PCB 260 comprises additional electronics for performing various camera functions. For example, the PCB 260 may comprise one or more digital signal processors (e.g., an image processor, video processor, and/or image capture accelerator), one or more general purpose processors, one or more microcontrollers, one or more memory controllers, one or more interface controllers, or other associated electronics.

Certain components of the PCB 260, particularly components such as high power image and video processing components, may generate a significant amount of heat during operation. Absent adequate heat dissipation, these components may overheat causing performance of the camera 100 to suffer or causing permanent damage to the electronics. In order to adequately dissipate heat, the high power electronics include thermal contacts 262 that thermally couple to heat sink arms 252 of the front structure 250 when the camera 100 is assembled. In one embodiment, the thermal contacts 262 are the top surface of the integrated circuits and are of a material conventionally used in integrated circuits. Alternatively, the thermal contacts 262 may comprise a material designed to increase thermal conductivity from the integrated circuits to the heat sink arms 252. The heat sink arms 252 are thermally coupled to the front perimeter portion 108 and collectively act to dissipate heat from the electronics on the PCB 260 to the external surface of the camera 100. In one embodiment, the heat sink arms 252 comprise a thermally conductive material (e.g., metal). Furthermore, in one embodiment, the front perimeter portion 108 and heat sink arms 252 comprise the same material and are a unibody construction so as to provide efficient heat dissipation.

In an embodiment, the front structure 250 comprises two heat sink arms 252 that respectively physically contact (and thermally couple) different integrated circuits on the PCB 260. In this manner, the different integrated circuits have some thermal isolation from each other in order to reduce heat transfer from one component to another.

As shown in the illustrated embodiment, the image sensor PCB 276 is oriented substantially parallel to the lens window 102 when assembled while the PCB 260 is oriented in a plane substantially perpendicular to the lens window 102 and the image sensor PCB 276.

Figure 3A:
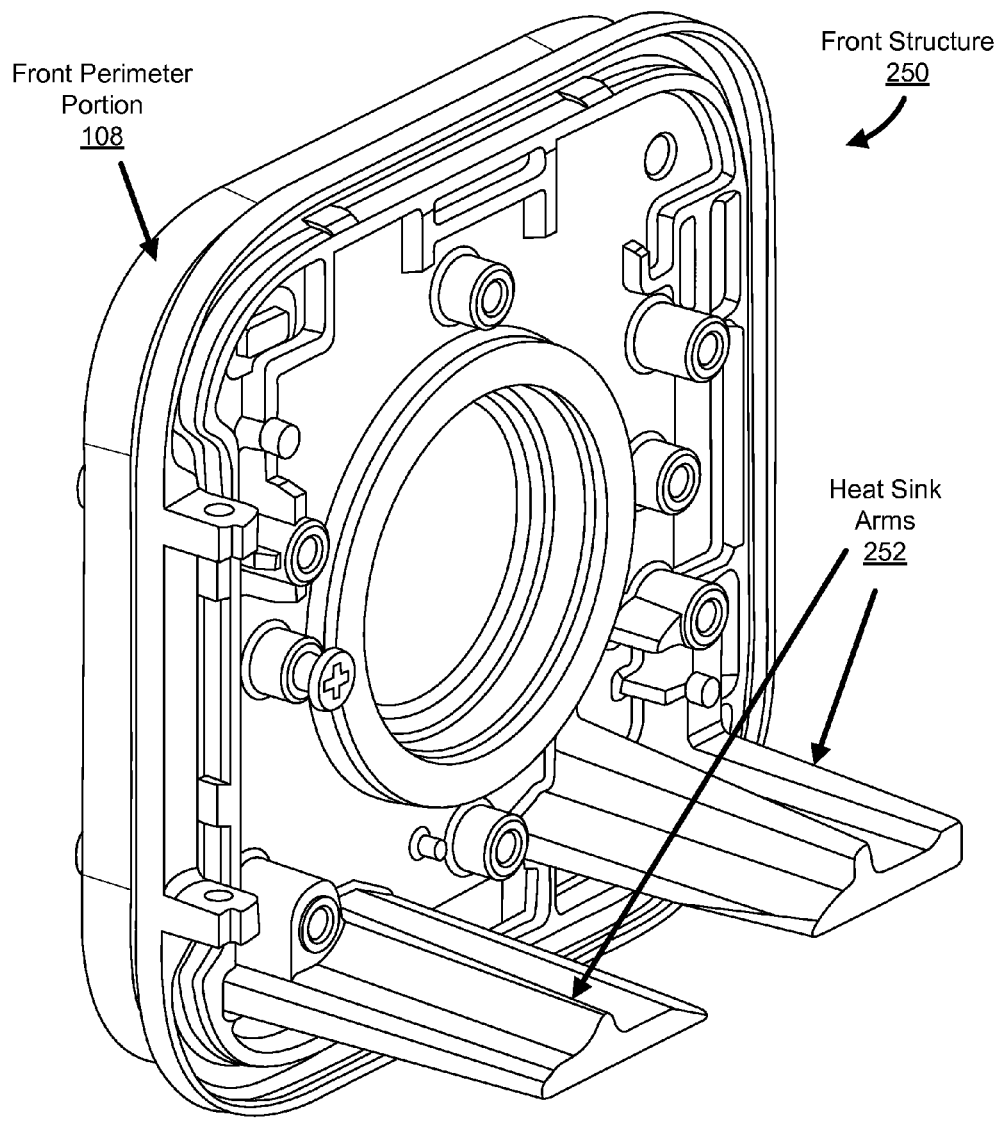
FIG. 3A illustrates a first perspective view of front structure of a camera, according to one embodiment.
Figure 3B:
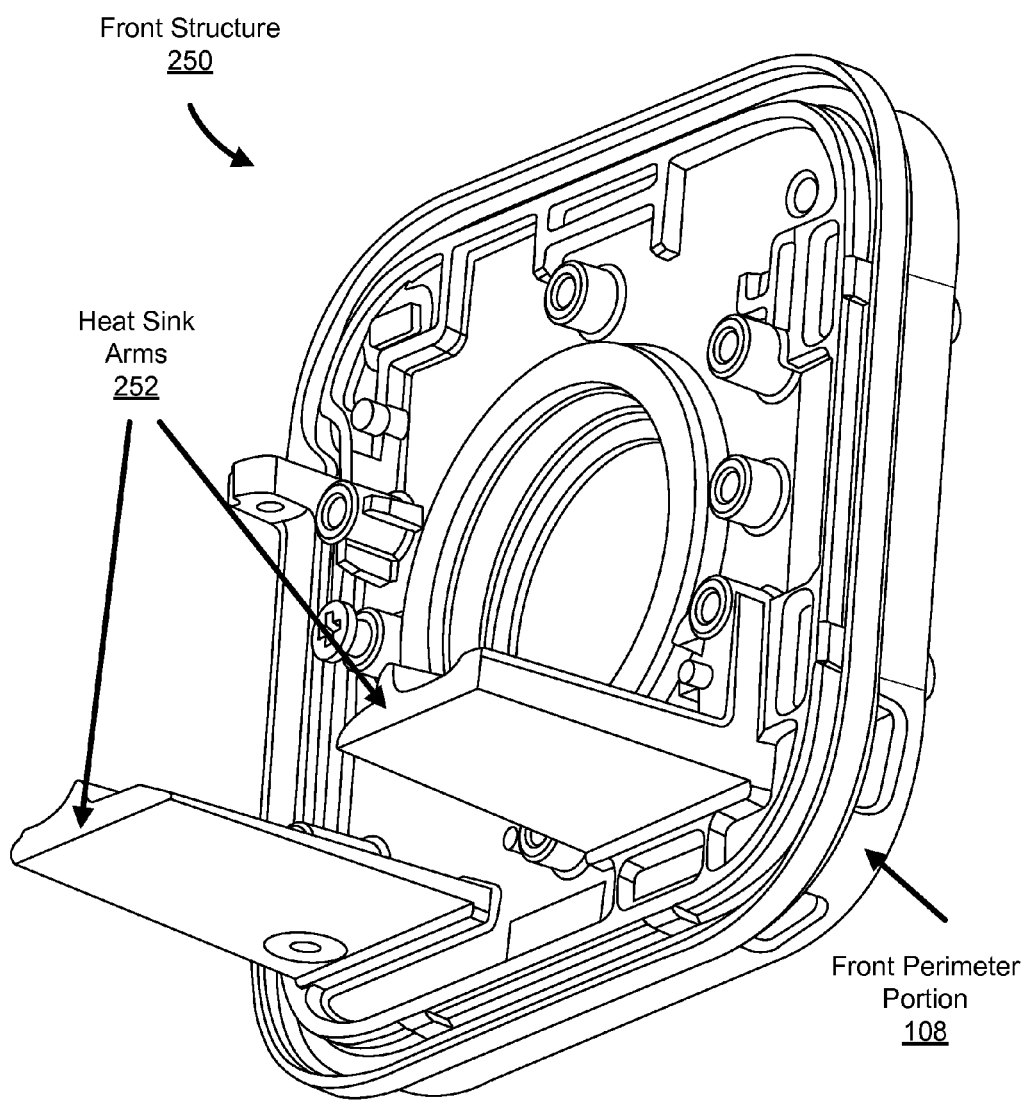
FIG. 3B illustrates a second perspective view of front structure of a camera, according to one embodiment.
Figure 3C:
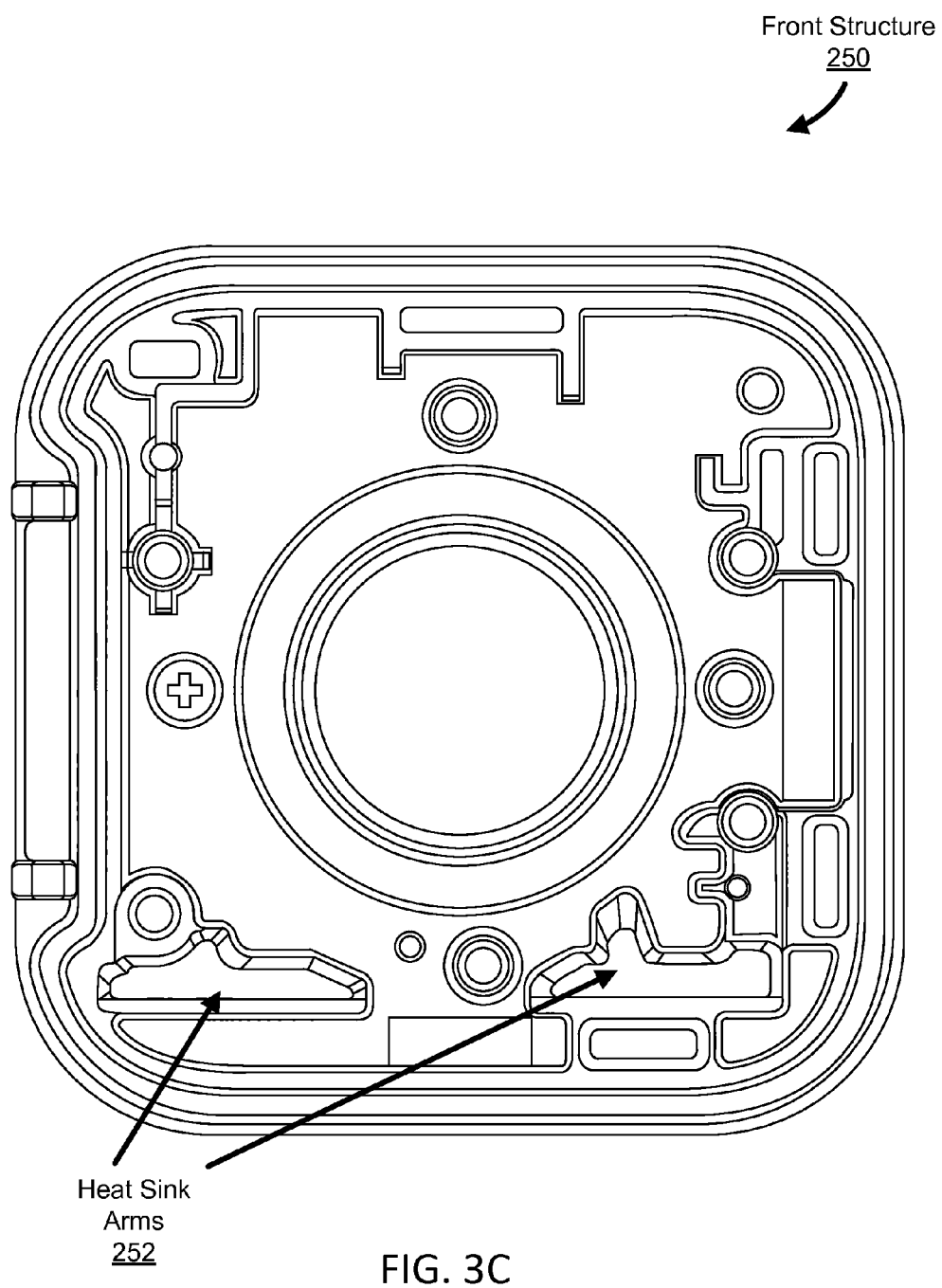
FIG. 3C illustrates a planar view of front structure of a camera, according to one embodiment.

FIGS. 3A-3C illustrate additional views of the front structure 250 showing the structure of the heat sink arms 252.

Figure 4:
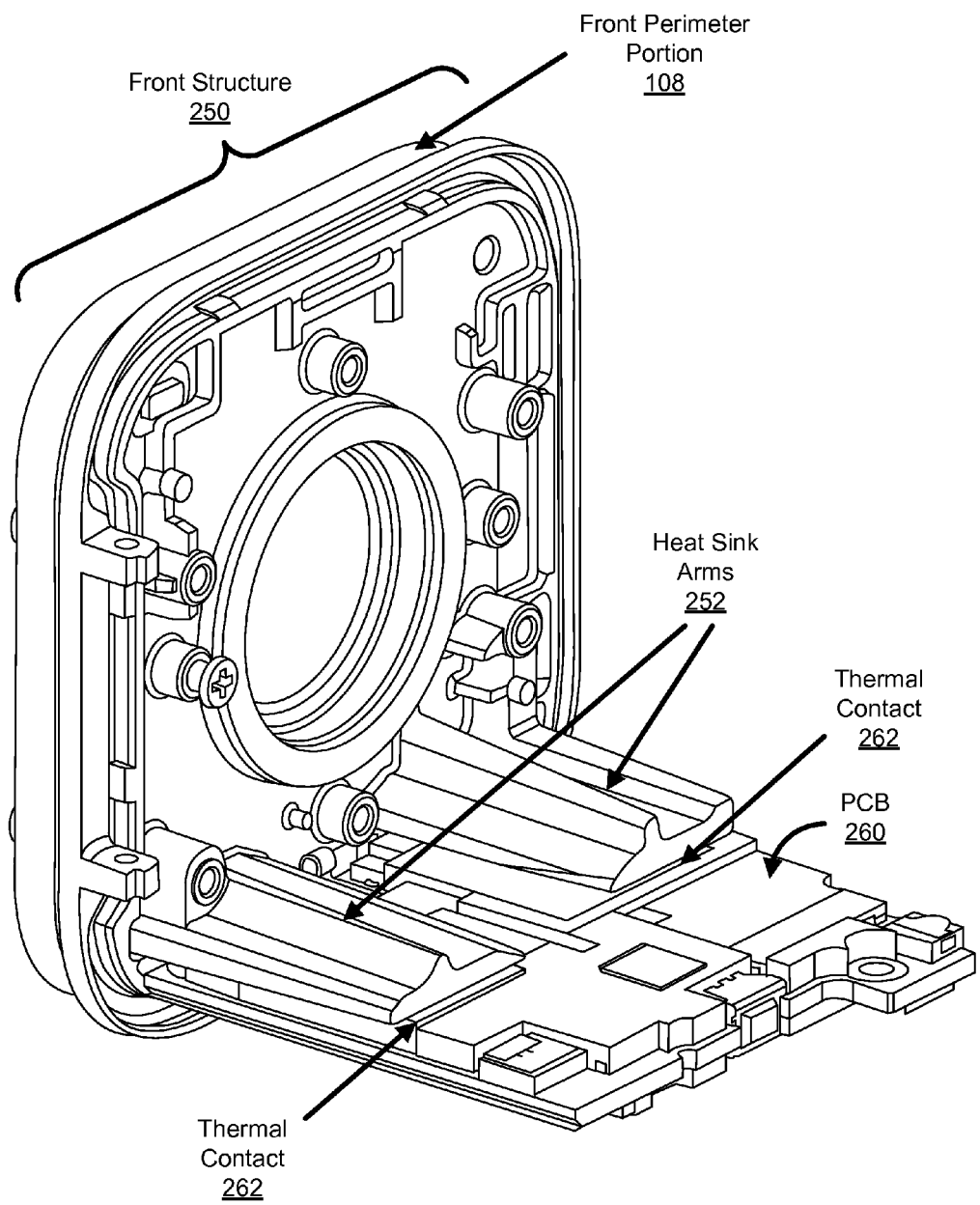
FIG. 4 illustrates a front structure of a camera having heat sink arms thermally coupled to a printed circuit board (PCB), according to one embodiment.

FIG. 4 illustrates the front structure 250 and PCB 260 in the assembled camera 100 with other components of the camera 100 omitted. As can be seen, the heat sink arms 252 are structured so that they make physical contact with the thermal contacts 262 on the PCB 260. In one embodiment, the bottom surface of the heat sink arms 252 and the thermal contacts 262 are substantially flat so as to provide substantial surface area for conducting heat between the thermal contacts 262 and the heat sink arms 252.

Figure 5A:
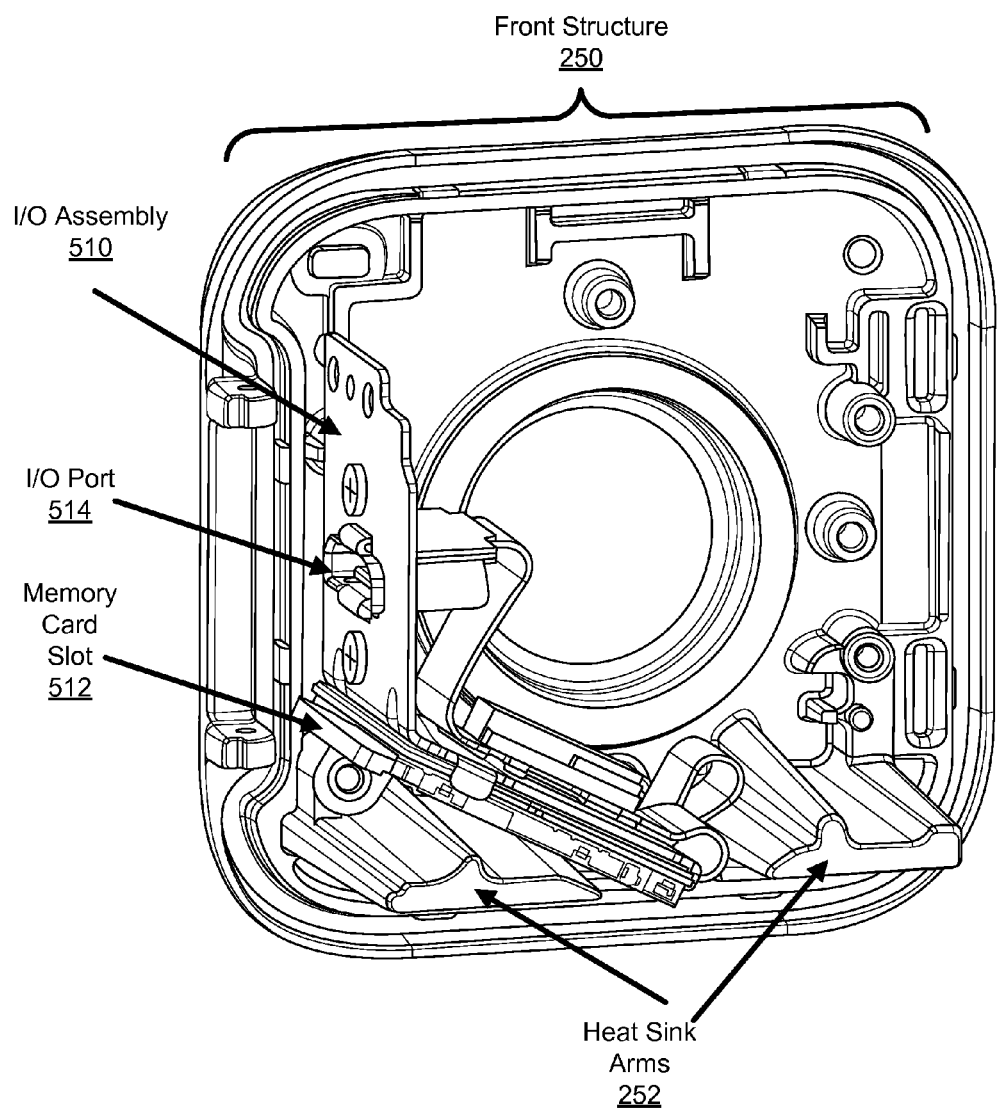
FIG. 5A illustrates a first view of a front structure of a camera and an I/O assembly, according to one embodiment.
Figure 5B:
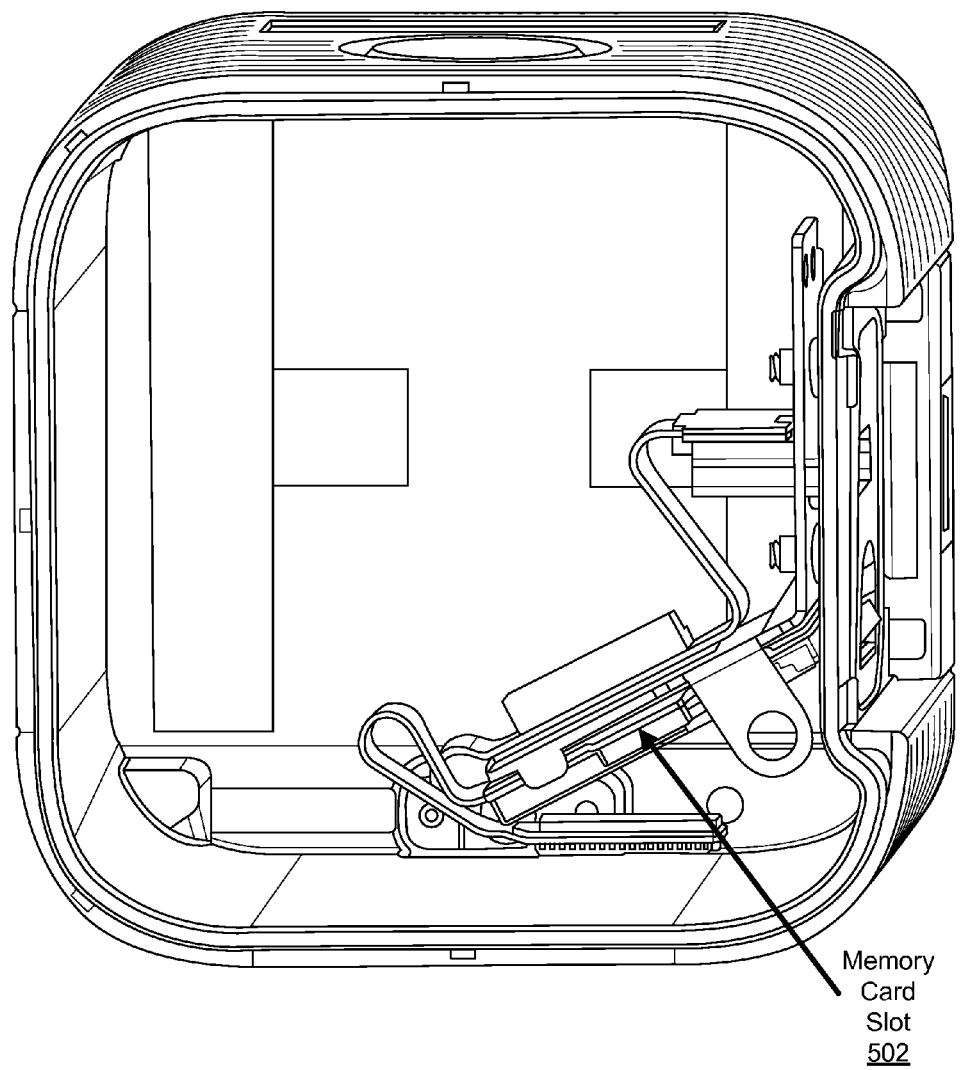
FIG. 5B illustrates a second view of a front structure of a camera and an I/O assembly, according to one embodiment.

FIG. 5A illustrates an embodiment of the front structure 250 and an I/O assembly 510 including a memory card slot 512 and an I/O port 514. Other components of the camera 100 are omitted from this figure for clarity. In one embodiment, the I/O assembly 510 is accessible behind the I/O door 106 described above. The I/O port 514 includes a communication port for communicating data to and from the camera. The I/O port 514 may comprise, for example, a USB port or an HDMI port. The memory card slot 512 is structured to receive a memory card for storing image and/or video data captured by the camera 100. In one embodiment, the memory card slot 512 has an opening on a side face of the camera 100 and is oriented diagonally relative to the front face of the camera 100 such that acute angles are formed between the side face of the camera having the opening to the memory card slot 512 and between the memory card slot 512 and a bottom face of the camera 100. Furthermore, in one embodiment, one of the heat sink arms 252 extends into a volume between the side face, the bottom, face, and the memory card slot 512. In one embodiment, the top surface of the heat sink arm 252 is angled to substantially match the angle of the memory card slot 512 so as to efficiently use physical space available within the square camera 100. FIG. 5B provides a view of the memory card slot 502 from the front of the camera 100. The diagonal orientation of the memory card slot 512 beneficially allows space for the centrally positioned integrated lens and sensor assembly 270, the heat sink arms 252, and other camera electronics.

Additional Configuration Considerations

Throughout this specification, some embodiments have used the expression "coupled" along with its derivatives. The term "coupled" as used herein is not necessarily limited to two or more elements being in direct physical or electrical contact. Rather, the term "coupled" may also encompass two or more elements are not in direct contact with each other, but yet still co-operate or interact with each other, or are structured to provide a thermal conduction path between the elements.

Likewise, as used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Finally, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Upon reading this disclosure, those of skill in the art will appreciate still additional alternative structural and functional designs for the described embodiments as disclosed from the principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

The invention claimed is:

1. A camera, comprising:
    an image sensor to capture images;
        a front face comprising a lens window;
        a lens assembly for directing light received through the lens window to the image sensor;
        a printed circuit board oriented substantially perpendicular to the front face of the camera and positioned under the lens assembly, the printed circuit board comprising at least one electronic component mounted on a surface of the printed circuit board, the at least one electronic component to process the images captured by the image sensor, the at least one electronic component generating heat when in operation; and
        a heat sink comprising an external portion structured around a perimeter of the lens window of the front face of the camera and at least one arm extending perpendicular from the external portion to the interior of the camera in between the printed circuit board and the lens assembly, the at least one arm thermally coupled to a top surface of the at least one electronic component on the printed circuit board so as to provide a thermally conductive path for the heat generated by the at least one electronic component to an external surface of the camera.

2. The camera of claim 1,
    wherein the at least one arm comprises a first arm thermally coupled to a first electronic component and a second arm thermally coupled to a second electronic component.

3. The camera of claim 1, further comprising:
    an integrated housing including the front face and a second housing portion, wherein the integrated housing encloses the image sensor, the lens assembly, and the printed circuit board,
    wherein the second housing portion has a substantially lower thermal conductivity than the heat sink.

4. The camera of claim 1, further comprising:
    an integrated housing having a substantially cubic form factor, wherein the integrated housing includes the front face and a second housing portion, wherein the integrated housing encloses the image sensor, the lens assembly, and the printed circuit board.

5. The camera of claim 1, wherein the lens window is substantially square.

6. The camera of claim 1, further comprising:
    a memory card slot having an opening on a side face of the camera, the memory card slot oriented diagonally relative to the front face of the camera such that acute angles are formed between the side face of the camera having the opening and the memory card slot, and between a bottom face of the camera and the memory card slot.

7. The camera of claim 6, wherein a first arm of the at least one arm extends between the memory card slot, the side face of the camera, and the bottom face of the camera.

8. The camera of claim 1, wherein the lens assembly comprises an image sensor printed circuit board oriented substantially parallel to the lens window.

9. A camera, comprising:
an image sensor to capture images;
a front face comprising a lens window;
a lens assembly for directing light received through the lens window to an image sensor;
a printed circuit board comprising at least one electronic component mounted on a surface of the printed circuit board, the at least one electronic component to process the images captured by the image sensor, the at least one electronic component generating heat when in operation;
a memory card slot having an opening on a side face of the camera, the memory card slot oriented diagonally relative to the front face of the camera such that acute angles are formed between the side face of the camera having the opening and the memory card slot, and between a bottom face of the camera and the memory card slot; and
a heat sink comprising an external portion structured around a perimeter of the lens window and at least one arm extending into the interior of the camera through an opening between the side face of the camera, the bottom face of the camera, and the memory card slot, the at least one arm thermally coupled to the at least one electronic component on the printed circuit board so as to provide a thermally conductive path for the heat generated by the at least one electronic component to an external surface of the camera.

10. The camera of claim 9, wherein the printed circuit board is oriented substantially perpendicular to the front face of the camera.

11. The camera of claim 9, wherein the lens assembly comprises an image sensor printed circuit board oriented substantially parallel to the lens window, the image sensor printed circuit board comprising an image sensor to capture image data based on light directed through the lens assembly.

12. The camera of claim 9, wherein the lens window is substantially square.

13. The camera of claim 9,
wherein the at least one arm comprises a first arm thermally coupled to a first electronic component and a second arm thermally coupled to a second electronic component.

14. The camera of claim 9, further comprising:
an integrated housing including the front face and a second housing portion, wherein the integrated housing encloses the image sensor, the lens assembly, and the printed circuit board,
wherein the second housing portion has a substantially lower thermal conductivity than the heat sink.

15. The camera of claim 9, further comprising:
an integrated housing having a substantially cubic form factor, wherein the integrated housing includes the front face and a second housing portion, wherein the integrated housing encloses the image sensor, the lens assembly, and the printed circuit board.

16. A camera, comprising:
a lens assembly for directing light received through a lens window to an image sensor;
a first portion of a substantially cubic camera housing enclosing the lens assembly, the first portion of the substantially cubic camera housing comprising a bottom face, left face, right face, back face, and top face each comprising a first material;
a front face of the substantially cubic camera housing comprising a substantially square lens window and a front face perimeter portion surrounding the lens window, the front face perimeter portion comprising a material having a thermal conductivity substantially higher than the first material, wherein the front face perimeter portion is thermally coupled to heat-producing internal electronics of the camera to dissipate heat from the heat-producing internal electronics during operation; and
a memory card slot having an opening on a side face of the camera, the memory card slot oriented diagonally relative to the front face of the camera such that acute angles are formed between the side face of the camera having the opening and the memory card slot, and between a bottom face of the camera and the memory card slot.

17. The camera of claim 16, further comprising:
a printed circuit board internal to the camera, the printed circuit board comprising at least one electronic component mounted on a surface of the printed circuit board, the at least one electronic component to process images captured by the image sensor, the at least one electronic component generating heat when in operation; and
a heat sink comprising the front face perimeter portion and at least one arm extending perpendicular from the external portion to the interior of the camera, the at least one arm thermally coupled to the at least one electronic component on the printed circuit board so as to provide a thermally conductive path for the heat generated by the at least one electronic component to an external surface of the camera.

18. The camera of claim 17, wherein the printed circuit board is oriented substantially perpendicular to the front face of the camera.

19. The camera of claim 16, wherein the lens assembly comprises an image sensor printed circuit board oriented substantially parallel to the lens window, the image sensor printed circuit board comprising an image sensor to capture image data based on light directed through the lens assembly.

20. The camera of claim 16, further comprising:
a heat sink comprising the front face perimeter portion and at least one arm extending perpendicular from the external portion to the interior of the camera, the at least one arm thermally coupled to the at least one electronic component on the printed circuit board so as to provide a thermally conductive path for the heat generated by the at least one electronic component to an external surface of the camera, wherein a first arm of the at least one arm extends between the memory card slot, the side face of the camera, and the bottom face of the camera.

* * * * *